US012575428B2

(12) United States Patent
Ozawa et al.

(10) Patent No.: US 12,575,428 B2
(45) Date of Patent: Mar. 10, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Kodai Ozawa, Tokyo (JP); Sho Nakanishi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 398 days.

(21) Appl. No.: 18/188,084

(22) Filed: Mar. 22, 2023

(65) Prior Publication Data

US 2023/0387064 A1 Nov. 30, 2023

(30) Foreign Application Priority Data

May 25, 2022 (JP) ................................. 2022-085272

(51) Int. Cl.
H01L 23/485 (2006.01)
H01L 23/00 (2006.01)
(Continued)

(52) U.S. Cl.
CPC ............ H01L 24/32 (2013.01); H01L 23/485 (2013.01); H01L 23/49513 (2013.01);
(Continued)

(58) Field of Classification Search
CPC ... H01L 24/40; H01L 23/49513; H01L 24/32; H01L 24/37; H01L 24/73; H01L 24/83;
(Continued)

(56) References Cited

U.S. PATENT DOCUMENTS

| | | | | |
|---|---|---|---|---|
| 6,066,891 A | * | 5/2000 | Yamaoka | .......... H01L 21/28518 |
| | | | | 257/750 |
| 6,514,292 B1 | * | 2/2003 | Atala | ...................... A61L 27/58 |
| | | | | 623/23.72 |
| 7,977,789 B2 | * | 7/2011 | Park | ........................ H01L 24/03 |
| | | | | 257/737 |
| 9,972,708 B2 | * | 5/2018 | Xie | ...................... H10D 62/357 |

(Continued)

FOREIGN PATENT DOCUMENTS

| | | |
|---|---|---|
| JP | H10-163467 A | 6/1998 |
| JP | 2007-005368 A | 1/2007 |

(Continued)

OTHER PUBLICATIONS

Notice of Reasons for Refusal received in corresponding to Japanese Patent Application No. 2022-085272, dated Nov. 25, 2025.

*Primary Examiner* — Vu A Vu
(74) *Attorney, Agent, or Firm* — Rimon P.C.

(57) ABSTRACT
A semiconductor device includes a lead, a semiconductor substrate, a back-surface electrode provided between the semiconductor substrate and the lead, and a solder layer configured to connect the back-surface electrode and the lead. The back-surface electrode includes a silicide layer formed on a back surface of the semiconductor substrate, a bonding layer formed on the lead, a barrier layer formed on the bonding layer, and a stress relaxation layer formed between the silicide layer and the barrier layer. The stress relaxation layer is made of a first metal film containing aluminum as a main component or a second metal film containing gold, silver, or copper as a main component.

11 Claims, 12 Drawing Sheets

SD

TR    BP2    BP1    MR

ET(LS)    BP2    CP2    DP(LS)    CP1  BP1    CT(LS)

(51) Int. Cl.
  *H01L 23/495* (2006.01)
  *H10D 62/10* (2025.01)

(52) U.S. Cl.
  CPC ............... *H01L 2224/32245* (2013.01); *H01L 2924/01023* (2013.01); *H01L 2924/01028* (2013.01); *H01L 2924/1203* (2013.01); *H01L 2924/13055* (2013.01); *H01L 2924/1815* (2013.01); *H10D 62/102* (2025.01)

(58) Field of Classification Search
  CPC .................... H01L 24/84; H01L 24/92; H01L 2224/32245; H01L 2224/37013; H01L 2224/40151; H01L 2224/73263; H01L 2224/838; H01L 23/49548; H01L 2224/84815; H01L 2224/9221; H01L 24/29; H01L 23/49562
  USPC ......................................................... 257/676
  See application file for complete search history.

(56) References Cited

U.S. PATENT DOCUMENTS

| | | | |
|---|---|---|---|
| 11,456,359 B2 | 9/2022 | Hoshi et al. | |
| 11,476,170 B2 * | 10/2022 | Kaji ........................ | H01L 24/73 |
| 11,756,915 B2 * | 9/2023 | Kim .................... | H01L 23/3735 |
| | | | 257/777 |
| 11,881,444 B2 * | 1/2024 | Umeda ............. | H01L 23/49503 |
| 11,935,936 B2 | 3/2024 | Ujihara et al. | |
| 12,249,561 B2 * | 3/2025 | Scharf ................. | H01L 23/3142 |
| 2017/0092596 A1 * | 3/2017 | Yoshihara ......... | H01L 23/49579 |
| 2018/0223416 A1 | 8/2018 | Matsumura | |
| 2022/0005743 A1 * | 1/2022 | Osawa .................. | H01L 23/367 |
| 2023/0095749 A1 * | 3/2023 | Heinrich .............. | B23K 35/262 |
| | | | 257/746 |

FOREIGN PATENT DOCUMENTS

| | | | |
|---|---|---|---|
| JP | 2017-031475 A | 2/2017 | |
| JP | 2017-059720 A | 3/2017 | |
| WO | 2020/003667 A1 | 1/2020 | |

* cited by examiner

FIG. 2

SEMICONDUCTOR DEVICE AND METHOD OF MANUFACTURING THE SAME

CROSS-REFERENCE TO RELATED APPLICATIONS

The disclosure of Japanese Patent Application No. 2022-085272 filed on May 25, 2022 including the specification, drawings and abstract is incorporated herein by reference in its entirety.

BACKGROUND

The present invention relates to a semiconductor device and a method of manufacturing the same, and relates to, for example, a semiconductor device incorporating a fast recovery diode and a method of manufacturing the same.

Insulated gate bipolar transistors (hereafter referred to as IGBTs) are prevailing as power devices for driving inverters and motors. In the application of driving inverters and motors by IGBTs, diodes are also used together as a path for flowing a reverse current that occurs in switching. This diode is referred to as a freewheeling diode, and a fast recovery diode (hereinafter referred to as FRD) is used in general. One of the characteristics required for the freewheeling diode is high speed and a short reverse recovery time trr. Since the turn-on loss in switching is greatly affected by the recovery current, FRDs with a short reverse recovery time trr are effective for reducing the loss. Therefore, a semiconductor device in which an IGBT and an FRD are incorporated in a package has been prepared.

This semiconductor device includes a sealing body in which an IGBT and an FRD are incorporated and a plurality of leads serving as external terminals. The leads extend inside the sealing body, and the IGBT and FRD are mounted in a region referred to as a die pad in the sealing body. Each of the IGBT and the FRD has a back-surface electrode formed by stacking a plurality of metal layers, and the back-surface electrode and the lead are connected by a solder layer.

There is disclosed a technique listed below. [Patent Document 1] Japanese Unexamined Patent Application Publication No. 2007-005368

Patent Document 1 discloses a structure of a back-surface electrode of an IGBT chip.

SUMMARY

Studies by the inventors of this application have revealed that the leakage current generated when applying a reverse bias to an FRD increases due to the structure of the back-surface electrode of the FRD.

A reduction in leakage current is required in a semiconductor device incorporating an FRD.

Other problems and novel features will be apparent from the descriptions in the specification and the accompanying drawings.

An outline of a typical one of the embodiments disclosed in this application will be briefly described as follows.

A semiconductor device according to one embodiment includes a lead, a semiconductor substrate, a back-surface electrode provided between the semiconductor substrate and the lead, and a solder layer configured to connect the back-surface electrode and the lead. The back-surface electrode includes a silicide layer formed on a back surface of the semiconductor substrate, a bonding layer formed on the lead, a barrier layer formed on the bonding layer, and a stress relaxation layer formed between the silicide layer and the barrier layer. The stress relaxation layer is made of a first metal film containing aluminum as a main component or a second metal film containing gold, silver, or copper as a main component.

A method of manufacturing a semiconductor device according to one embodiment includes: preparing a semiconductor substrate having a main surface and a back surface, forming a silicide layer on the back surface, forming a stress relaxation layer on the silicide layer, forming a barrier layer on the stress relaxation layer, forming a bonding layer on the barrier layer, and mounting the semiconductor substrate on a lead and connecting the lead and the bonding layer with a solder layer. The stress relaxation layer is made of a first metal film containing aluminum as a main component or a second metal film containing gold, silver, or copper as a main component.

According to one embodiment, it is possible to suppress the occurrence of leakage current in a semiconductor device.

BRIEF DESCRIPTION OF THE DRAWINGS

FIG. 2 is an equivalent circuit diagram of the semiconductor device according to the present embodiment.

DETAILED DESCRIPTION

Figure 1:
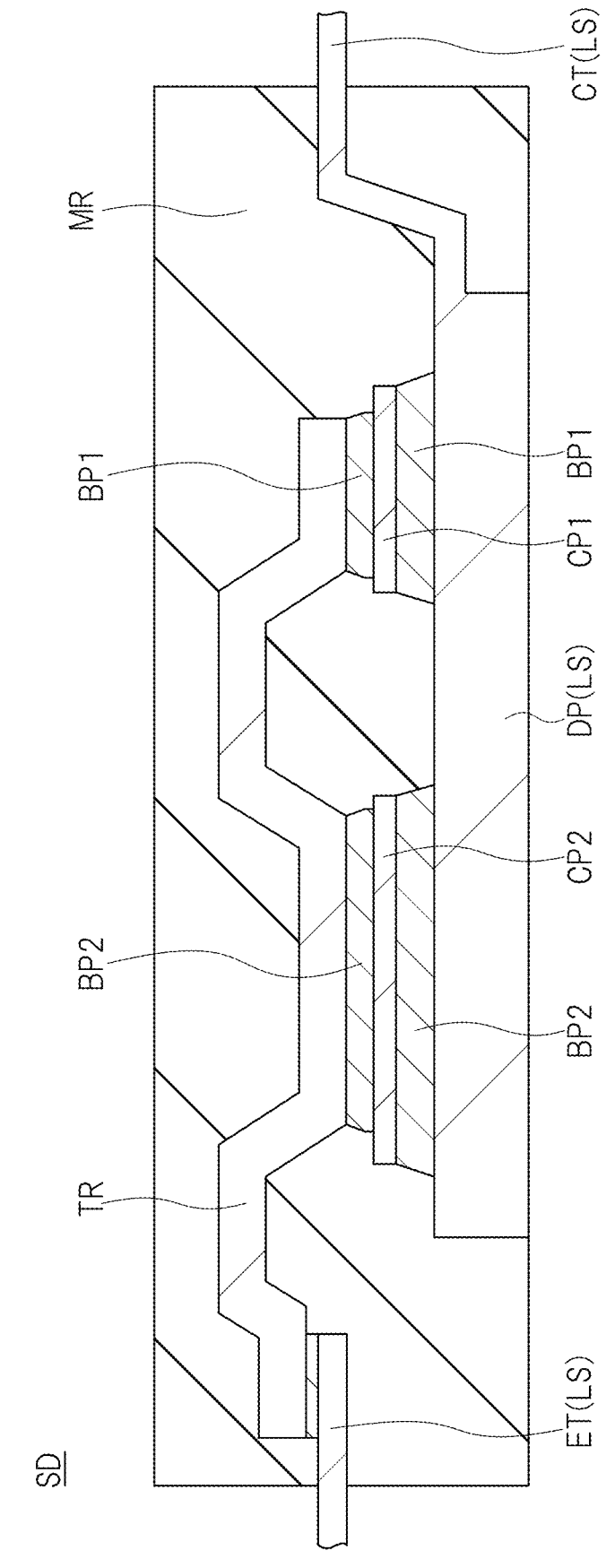
FIG. 1 is a cross-sectional view of a semiconductor device according to the present embodiment.

In the following description, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof.

Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in all the drawings for describing the embodiments, the same members are denoted by the same reference characters and the repetitive description thereof will be omitted. Further, hatching is used even in a plan view so as to make the drawings easy to see.

In addition, in the following embodiments, a P-type means a P conductivity type and an N-type means an N conductivity type.

DESCRIPTION OF RELATED ART

The related art mentioned in this specification is not a well-known art, but is an art having a problem found by the inventors and serving as a basis of the invention of this application.

Figure 10:
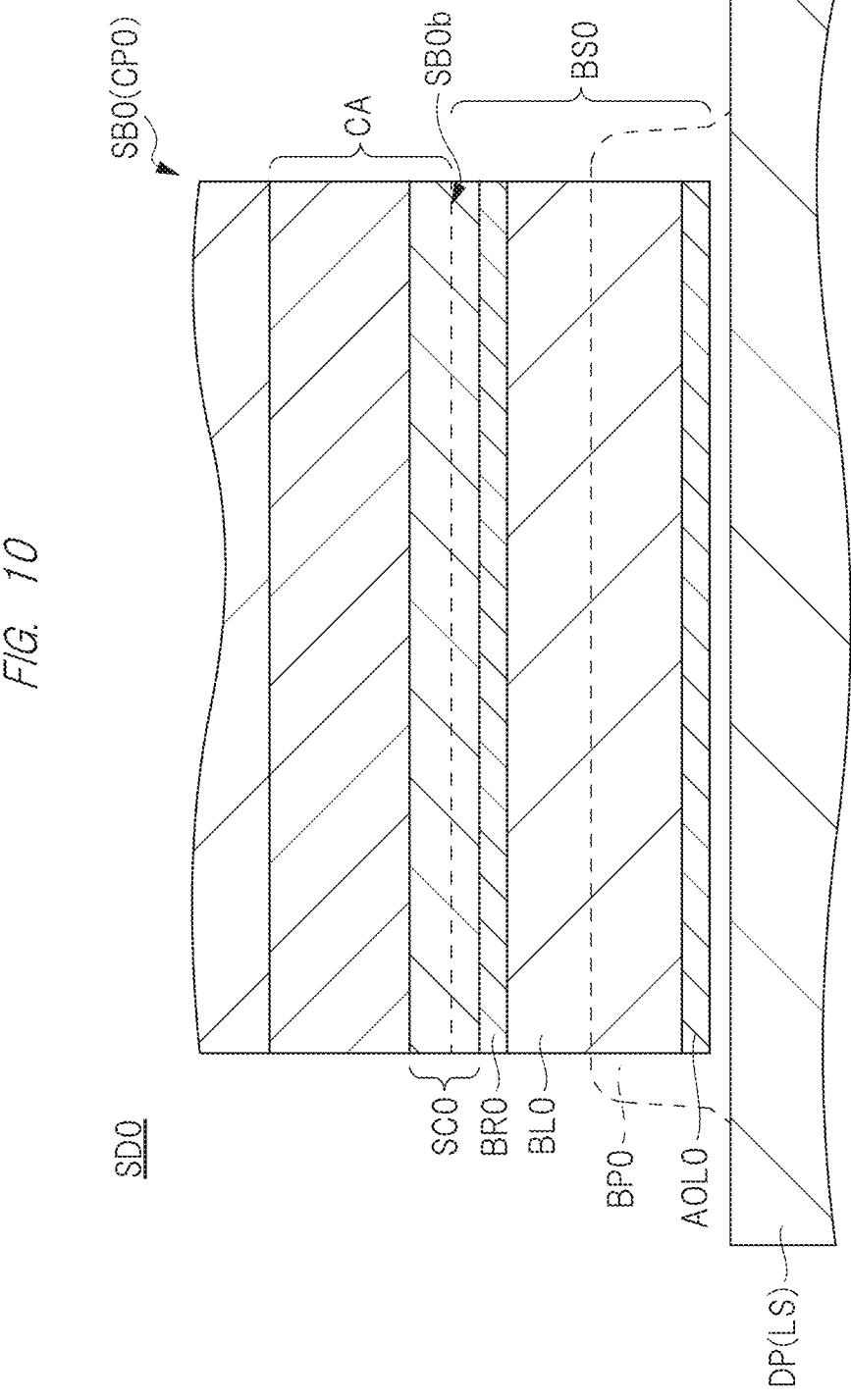
FIG. 10 is a cross-sectional view of a semiconductor device according to a related art.
Figure 11:
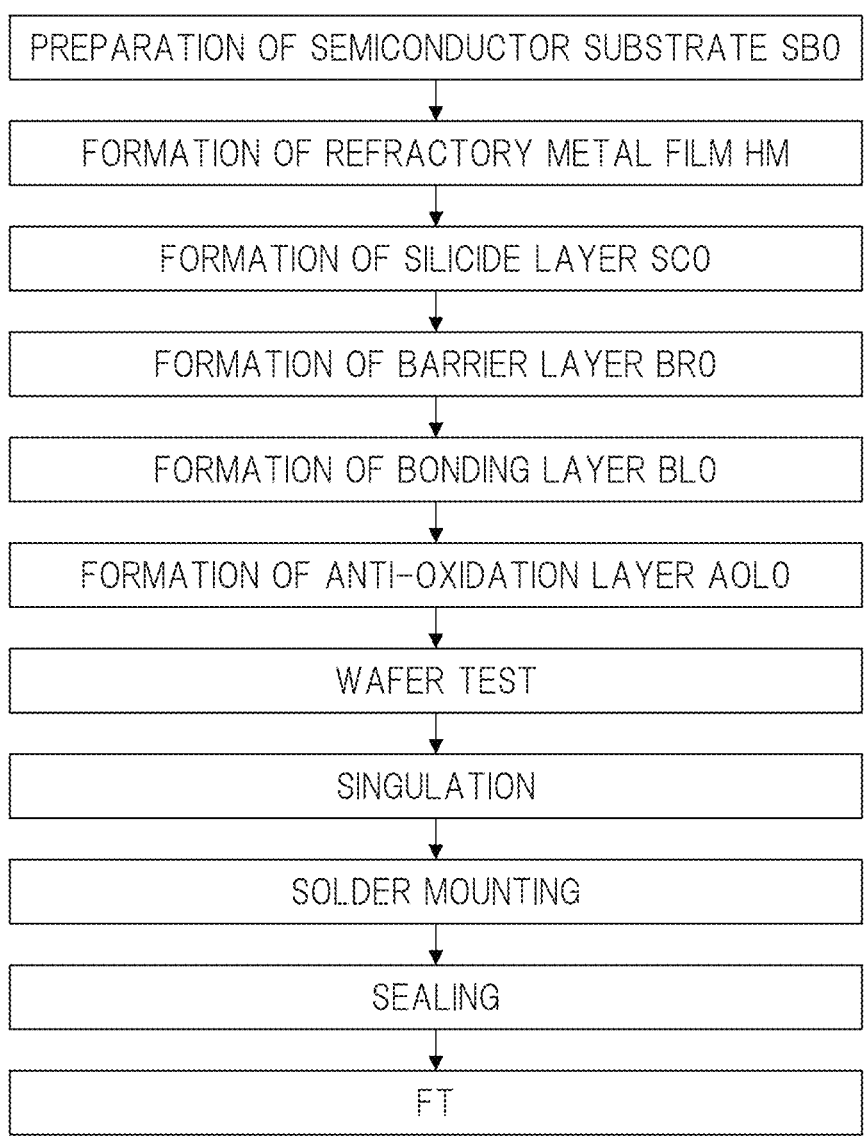
FIG. 11 is a process flowchart showing a manufacturing step of the semiconductor device according to the related art.
Figure 12:
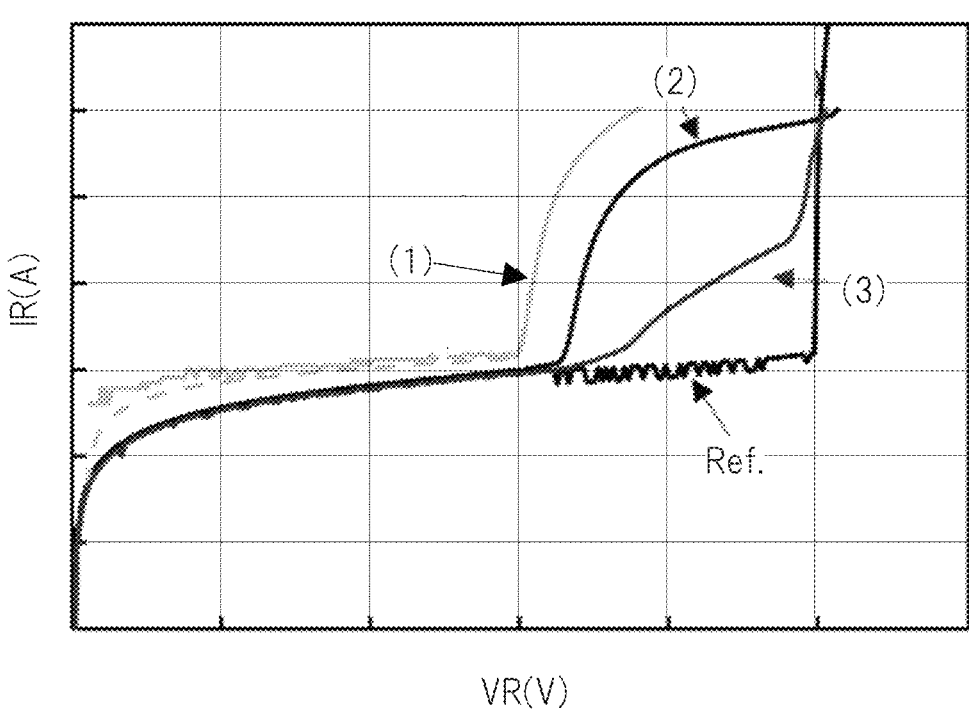
FIG. 12 is a diagram showing electrical characteristics of the semiconductor device according to the related art.

FIG. 10 is a cross-sectional view of a semiconductor device according to a related art, FIG. 11 is a process flowchart showing a manufacturing step of the semiconductor device according to the related art, and FIG. 12 is a diagram showing electrical characteristics of the semiconductor device according to the related art. A semiconductor device SD0 according to the related art has an FRD, FIG. 10 shows a cross-sectional view of the FRD, FIG. 11 shows a process flowchart of a manufacturing step of the FRD, and FIG. 12 shows electrical characteristics of the FRD.

As shown in FIG. 10, a semiconductor chip CP0 functioning as an FRD includes a semiconductor substrate SB0 and a back-surface electrode BS0. A cathode region CA which is an N-type semiconductor region is formed in the semiconductor substrate SB0 made of silicon on a side of the back surface SB0b, and the back-surface electrode BS0 is formed on the back surface SB0b of the semiconductor substrate SB0. Then, the semiconductor chip CP0 is mounted on a region referred to as a die pad DP of a lead LS, and the back-surface electrode BS0 and the lead LS are connected by a solder layer BP0.

The back-surface electrode BS0 is configured by metal films stacked in a plurality of layers, and includes a silicide layer SC0, a barrier layer BR0, a bonding layer BL0, and an anti-oxidation layer AOL0 formed from the side of the semiconductor substrate SB0. The bonding layer BL0 is a nickel (Ni) layer. The solder layer BP0 is a lead-free solder layer made of an alloy such as tin (Sn) and copper (Cu), tin (Sn) and silver (Ag), tin (Sn), silver, and copper (Cu), and others, and contains tin (Sn) as the main component (90% or more). In the step of "solder mounting" for electrically and mechanically connecting the semiconductor chip CP0 to the lead LS, the solder layer BP0 is melted at a high temperature, and nickel (Ni) of the bonding layer BL0 and tin (Sn) of the solder layer BP0 form an alloy layer (Ni—Sn).

Next, with reference to FIG. 11, the problems of the related art found by the inventors will be described. From the step of "preparation of semiconductor substrate SB0" to the step of "wafer test", each step is performed on a disk-shaped semiconductor wafer in which a large number of semiconductor chips CP0 are arranged. The plurality of semiconductor chips CP0 in the semiconductor wafer is divided into individual semiconductor chips CP0 in the step of "singulation". In the step of "solder mounting", the singulated semiconductor chip CP0 is bonded to the lead LS with the solder layer BP0. Furthermore, in the step of "sealing", the semiconductor chip CP0 and the lead LS are sealed with a sealing body. Then, "FT" is performed on the sealed semiconductor chip CP0 (in other words, FRD). In the step of "wafer test", the semiconductor wafer is vacuum-sucked on a stage of a test apparatus, and the leakage current of the FRD formed in the semiconductor wafer is measured by applying a reverse bias voltage of a predetermined value to the FRD. The FT (Final Test) is a reliability test in which behavior of the leakage current is measured by applying a reverse bias voltage to the FRD.

As a result of the "wafer test", a large number of semiconductor chips CP0 which were determined as defective products because the leakage current value thereof was higher than the required value were detected. Further, when the semiconductor chip CP0 which was determined as a defective product was tested by another test method (vacuum suction weaker than the "wafer test"), it was determined as a non-defective product. As just described, it was found that the semiconductor chip CP0, which should have been determined as a non-defective product, was determined as a defective product.

In the step of "FT", a large number of semiconductor chips CP0 in which the required leakage current characteristics were not obtained and the leakage current increased at a low reverse bias voltage were detected. For analyzing the defective product in the step of "FT", after the semiconductor chip CP0 is detached from the sealing body and the lead LS and the solder layer BP0 adhering to the semiconductor chip CP0 is removed, the reverse bias voltage and the leakage current of the semiconductor chip CP (FRD) were measured. As a result, it was found that the solder layer BP0 affected the leakage current. FIG. 12 shows a relationship between the reverse bias voltage and the leakage current of the FRD in the related art. In FIG. 12, Ref. indicates the required electrical characteristics of the FRD, (1) indicates the electrical characteristics of the sample in a sealed state, (2) indicates the electrical characteristics of the sample obtained by performing the removing process of the solder layer BP0 once on the semiconductor chip CP0 detached from the sealing body and the lead LS, and (3) indicates the electrical characteristics of the sample obtained by performing the removing process of the solder layer BP0 twice on the semiconductor chip CP0 detached from the lead LS. Namely, it was found that the smaller the amount of the solder layer BP0 adhering to the semiconductor chip CP0, the closer to the required electrical characteristics of the FRD.

According to the studies by the inventors of this application, it was found that the stress on the semiconductor substrate SB0 caused the increase in leakage current due to the piezoelectric effect.

In the step of "wafer test", stress is applied to the semiconductor substrate SB0 because the semiconductor wafer is vacuum-sucked to the stage. The film thickness of the semiconductor wafer is 300 μm or less, and "warping" occurs in the semiconductor wafer. Since stress is locally generated in the semiconductor wafer when the semiconductor wafer having the "warping" is vacuum-sucked on a flat stage, it is conceivable that the leakage current of the semiconductor chip CP0 arranged at that position increases.

In addition, in the step of "solder mounting", the solder layer BP0 is melted at a high temperature (200° C. or higher) and then cooled (for example, to room temperature) to harden the solder layer BP0, and it is thus conceivable that stress is generated in the semiconductor chip CP0 due to expansion and contraction of the solder layer BP0.

Therefore, in the present embodiment, the stress which the semiconductor substrate SB1 receives is relaxed and the leakage current of the semiconductor chip CP1 (FRD) is reduced by providing a stress relaxation layer in the back-surface electrode BS1 of the semiconductor chip CP1 (FRD).

Embodiment

<Structure of Semiconductor Device>

Figure 2:
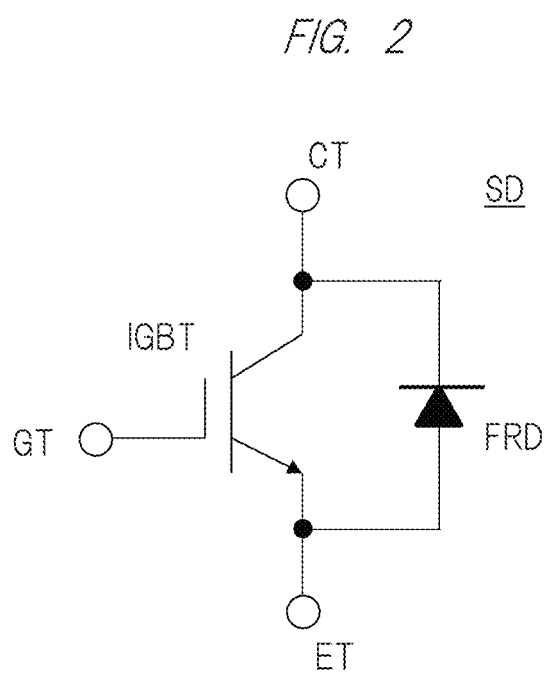
Figure 3:
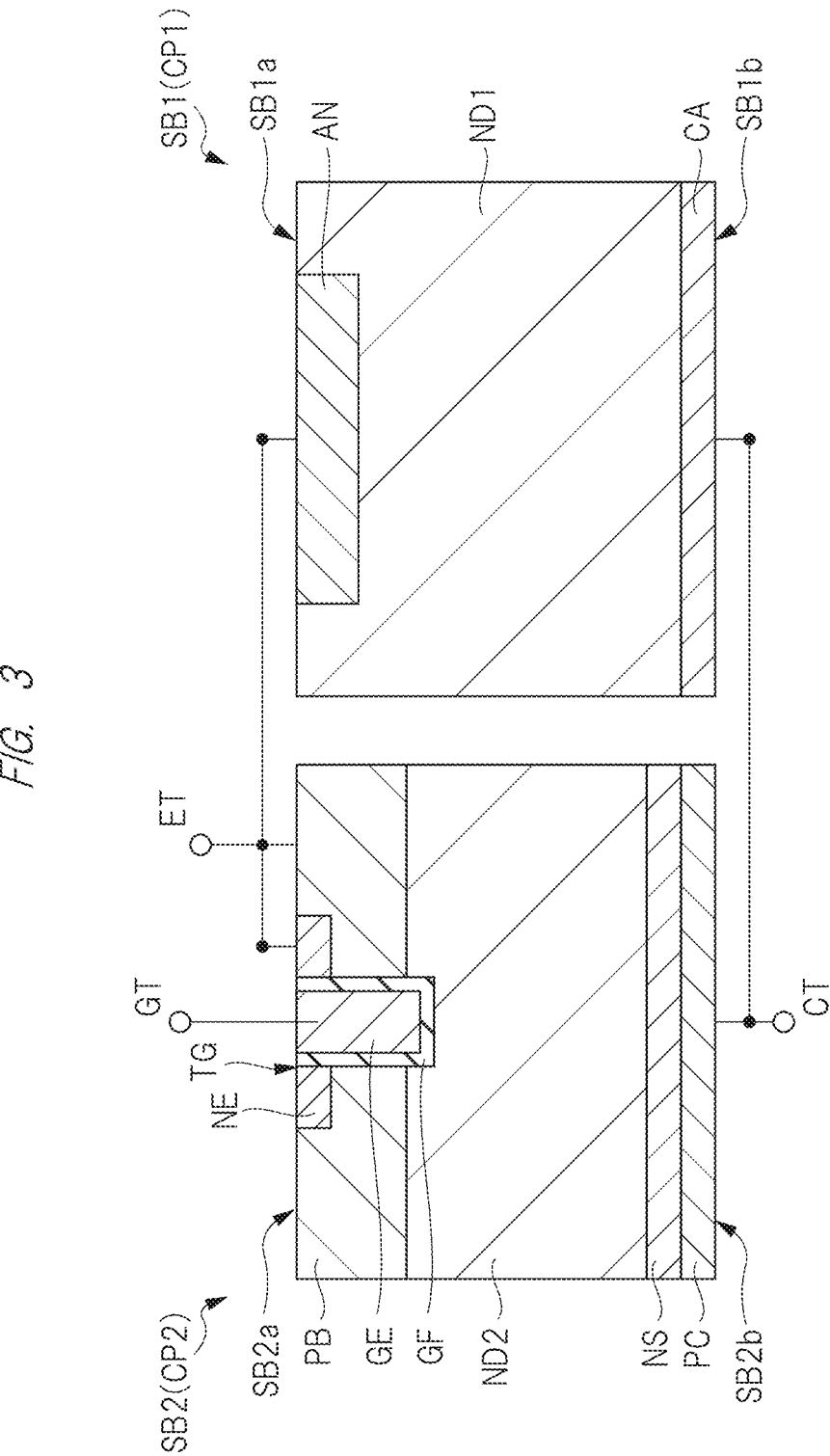
FIG. 3 is a schematic diagram of the semiconductor device according to the present embodiment.
Figure 4:
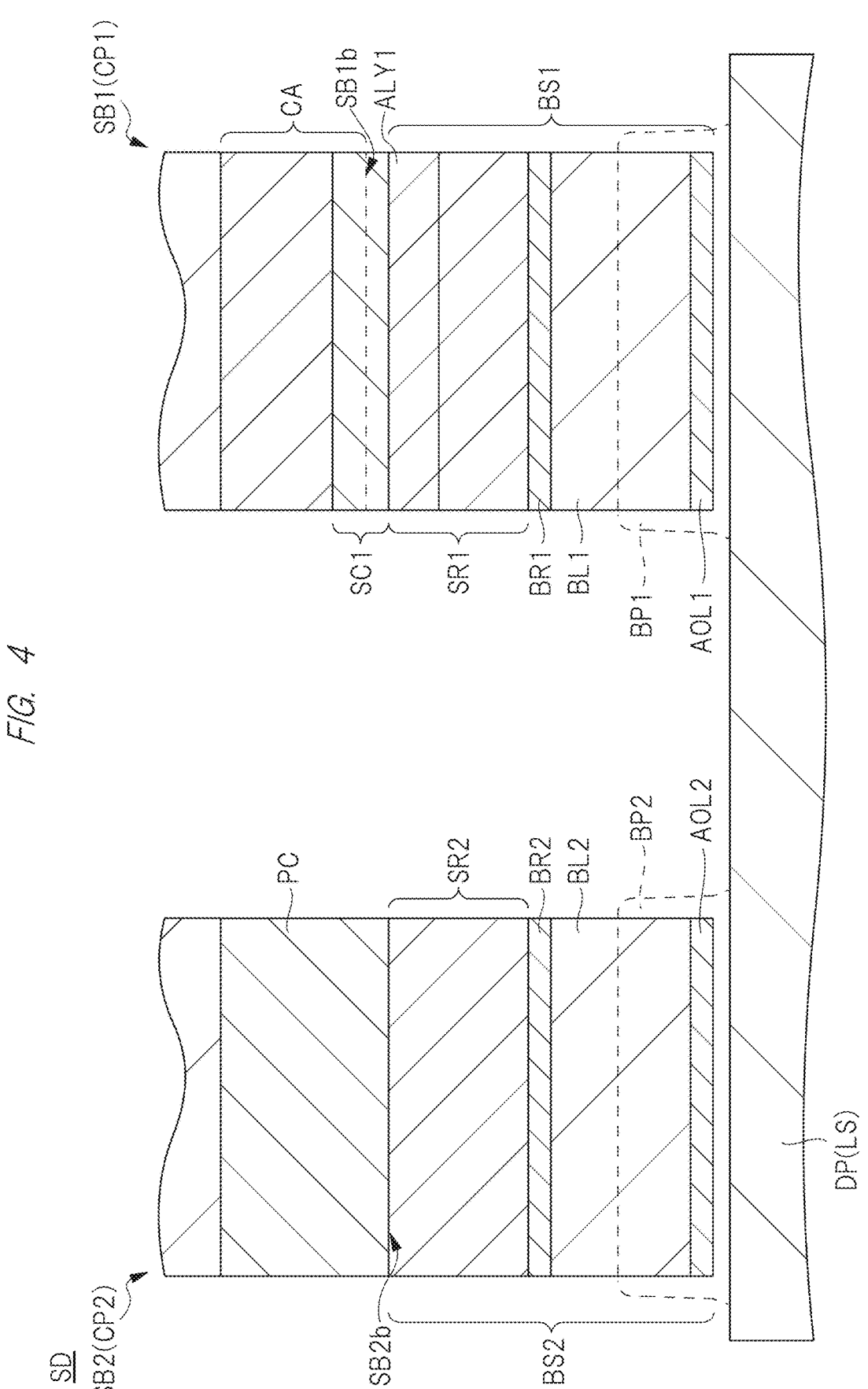
FIG. 4 is a cross-sectional view of the semiconductor device according to the present embodiment.

FIG. 1 is a cross-sectional view of a semiconductor device according to the present embodiment, FIG. 2 is an equivalent circuit diagram of the semiconductor device according to the present embodiment, FIG. 3 is a schematic diagram of the semiconductor device according to the present embodiment, and FIG. 4 is a cross-sectional view of the semiconductor device according to the present embodiment. A semiconductor device SD according to the present embodiment includes an IGBT and an FRD.

As shown in FIG. 1, the semiconductor device SD is provided with semiconductor chips CP1 and CP2, a lead LS including a die pad, a collector terminal, and an emitter terminal, and a sealing body MR. The semiconductor chip CP1 is an FRD, and the semiconductor chip CP2 is an IGBT. The semiconductor chips CP1 and CP2 are mounted on the die pad DP of the lead LS. The semiconductor chip CP1 is connected to the die pad DP (lead LS) by a solder layer BP1, the semiconductor chip CP2 is connected to the die pad DP (lead LS) by a solder layer BP2, and the die pad DP is connected to the collector terminal CT (lead LS). Also, the semiconductor chips CP1 and CP2 are connected to the emitter terminal ET (lead LS) via a connection terminal TR. The semiconductor chip CP1 is connected to the connection terminal TR by the solder layer BP1, and the semiconductor chip CP2 is connected to the connection terminal TR by the solder layer BP2. The sealing body MR made of an insulating resin (for example, epoxy resin) covers the semiconductor chips CP1 and CP2, the solder layers BP1 and BP2, the connection terminal TR, the die pad DP, the collector terminal CT, and the emitter terminal ET. However, the parts of the lead LS to be the collector terminal CT and the emitter terminal ET protrude outside the sealing body MR. In addition, the surface of the die pad DP opposite to the surface on which the semiconductor chips CP1 and CP2 are mounted is exposed from the sealing body MR. The die pad DP, the lead LS, and the connection terminal TR are formed of a copper plate or copper foil, and the film thickness of the die pad DP is larger than that of the collector terminal CT. Though not shown, a gate terminal GT (see FIG. 3) connected to the semiconductor chip CP2 (IGBT) is provided in the sealing body MR, and the part of the lead LS to be the gate terminal GT also protrudes outside the sealing body MR.

As shown in FIG. 2, the IGBT and the FRD are connected in parallel. The IGBT has the collector terminal CT, the emitter terminal ET, and the gate terminal GT, an anode of the FRD is connected to the emitter terminal ET, and a cathode of the FRD is connected to the collector terminal CT.

As shown in FIG. 3, the semiconductor chip CP1 functioning as an FRD is formed in a semiconductor substrate SB1, and the semiconductor substrate SB1 has a main surface SB1a and a back surface SB1b. An anode region AN which is a P-type semiconductor region is provided in the semiconductor substrate SB1 on the side of the main surface SB1a, a cathode region CA which is an N-type semiconductor region is provided in the semiconductor substrate SB1 on the side of the back surface SB1b, and a drift region ND1 which is an N-type semiconductor region is arranged between the anode region AN and the cathode region CA.

The semiconductor chip CP2 functioning as an IGBT is formed in a semiconductor substrate SB2, and the semiconductor substrate SB2 has a main surface SB2a and a back surface SB2b. In the semiconductor substrate SB2 on the side of the main surface SB2a, an emitter region NE which is an N-type semiconductor region and a body region PB which is a P-type semiconductor region arranged so as to surround the emitter region NE in plan view are arranged, and a drift region ND2 which is an N-type semiconductor region is arranged under the body region PB. A trench groove TG which penetrates the emitter region NE and the body region PB from the main surface SB2a to the back surface SB2b and reaches the drift region ND2 is provided, and a gate electrode GE is formed in the trench groove TG via a gate insulating film GF. A collector region PC which is a P-type semiconductor region is arranged in the semiconductor substrate SB2 on the side of the back surface SB2b, and a buffer region NS which is an N-type semiconductor region is arranged between the drift region ND2 and the collector region PC.

The cathode region CA of the semiconductor chip CP1 (FRD) and the collector region PC of the semiconductor chip CP2 (IGBT) are connected to the collector terminal CT. Also, the anode region AN of the semiconductor chip CP1 (FRD) and the emitter region NE and body region PB of the semiconductor chip CP2 (IGBT) are connected to the emitter terminal ET. Further, the gate electrode GE is connected to the gate terminal GT.

FIG. 4 shows the semiconductor chip CP1 (FRD) and the semiconductor chip CP2 (IGBT) that are mounted with solder on the die pad DP of the lead LS. The semiconductor chip CP1 includes the semiconductor substrate SB1 and a back-surface electrode BS1 formed on the back surface SB1b of the semiconductor substrate SB1, and the back-surface electrode BS1 is connected to the lead LS by the solder layer BP1. Similarly, the semiconductor chip CP2 includes the semiconductor substrate SB2 and a back-surface electrode BS2 formed on the back surface SB2b of the semiconductor substrate SB2, and the back-surface electrode BS2 is connected to the lead LS by the solder layer BP2.

The back-surface electrode BS1 is configured by a silicide layer SC1, a stress relaxation layer SR1, a barrier layer BR1, a bonding layer BL1, and an anti-oxidation layer AOL1 which are sequentially formed on the back surface SB1b of the semiconductor substrate SB1. The back-surface electrode BS2 is configured by a stress relaxation layer SR2, a barrier layer BR2, a bonding layer BL2, and an anti-oxidation layer AOL2 which are sequentially formed on the back surface SB2b of the semiconductor substrate SB2. A layer corresponding to the silicide layer SC1 of the back-surface electrode BS1 is not provided in the back-surface electrode BS2, and the stress relaxation layer SR2 is in contact with the back surface SB2b of the semiconductor substrate SB2. When the stress relaxation layer SR2 is made of a metal film containing aluminum (Al) as a main component described later, since the collector region PC which is a P-type semiconductor region is provided in the semiconductor substrate SB2 on the side of the back surface SB2$b$, an ohmic contact is established between the stress relaxation layer SR2 and the semiconductor substrate SB2, and a layer corresponding to the silicide layer SC1 can be omitted. Therefore, the manufacturing step of the semiconductor chip CP2 (IGBT) can be simplified. Since the stress relaxation layer SR2, the barrier layer BR2, the bonding layer BL2, and the anti-oxidation layer AOL2 constituting the back-surface electrode BS2 are the same as the stress relaxation layer SR1, the barrier layer BR1, the bonding layer BL1, and the anti-oxidation layer AOL1 constituting the back-surface electrode BS1, the description of the back-surface electrode BS1 is used as a substitute for the description of the back-surface electrode BS2.

When referring to each layer of the back-surface electrodes BS1 and BS2, the downward direction on the paper from the back surfaces SB1$b$ and SB2$b$ of the semiconductor substrates SB1 and SB2 to the die pad DP (lead LS) may be expressed as "on" in some cases.

The silicide layer SC1 is an alloy layer of refractory metal (for example, nickel (Ni) or titanium (Ti)) and silicon (Si), and the silicide layer SC1 is formed not only on the back surface SB1$b$, but also inside the semiconductor substrate SB1 (cathode region CA) from the back surface SB1$b$. By forming the silicide layer SC1, ohmic contact can be established between the back-surface electrode BS1 and the cathode region CA which is an N-type semiconductor region formed in the semiconductor substrate SB1 on the side of the back surface SB1$b$. For example, the silicide layer SC1 has a film thickness of 20 to 400 nm.

The stress relaxation layer SR1 is formed on the silicide layer SC1. The stress relaxation layer SR1 is a layer for relaxing the stress applied to the semiconductor substrate SB1 from the side of the bonding layer BL1 of the back-surface electrode BS1. Therefore, the stress relaxation layer SR1 is preferably made thicker than the barrier layer BR1, and the film thickness thereof is set to 400 to 1000 nm. The stress relaxation layer SR1 is a metal film containing aluminum (Al) as a main component (90% or more), and contains silicon (Si), copper (Cu), or silicon (Si) and copper (Cu) as additives. For example, it is made of Al—Si (Si: 0.5-1%), Al—Cu (Cu: 0.5-1%), or Al—Si—Cu (Si: 0.5-1%, Cu: 0.5-1%). Also, a metal film containing gold (Au), silver (Ag), or copper (Cu) as a main component can be used as the stress relaxation layer SR1.

Further, the stress relaxation layer SR1 is preferably made of a relatively flexible material. The Vickers hardness of the stress relaxation layer SR1 is lower than that of the barrier layer BR1 or the bonding layer BL1. For example, when the barrier layer BR1 is made of titanium (Ti) and the bonding layer BL1 is made of nickel (Ni), the Vickers hardness of titanium (Ti) is 0.97 Gpa and the Vickers hardness of nickel (Ni) is 0.638 Gpa. On the other hand, the metal films constituting the stress relaxation layer SR1 each have the Vickers hardness of 0.167 to 0.4 Gpa (metal film containing aluminum (Al) as a main component), 0.216 Gpa (gold (Au)), 0.251 Gpa (silver (Ag)), and 0.369 Gpa (copper (Cu)).

In addition, in the stress relaxation layer on the side of the silicide layer SC1, an alloy layer ALY1 made of the refractory metal contained in the silicide layer SC1 and the metal contained in the stress relaxation layer SR1 is formed. The alloy layer ALY1 is formed by the increase in the temperature of the semiconductor wafer in the step of forming the stress relaxation layer SR1, the barrier layer BR1, the bonding layer BL1, and the anti-oxidation layer AOL1 (deposition process of the metal films by sputtering). By forming the alloy layer ALY1, the connection between the silicide layer SC1 and the stress relaxation layer SR1 is strengthened, and peeling between the silicide layer SC1 and the stress relaxation layer SR1 can be prevented or reduced. The alloy layer ALY1 is formed by the diffusion of the refractory metal contained in the silicide layer SC1 into the stress relaxation layer SR1. For example, when the silicide layer SC1 is made of nickel silicide (NiSi) and the stress relaxation layer SR1 is made of a metal film containing aluminum (Al) as a main component, the alloy layer ALY1 is a nickel-aluminum (Ni—Al) alloy layer. Note that the alloy layer ALY1 is not limited to a film or layer as long as the effect of the alloy layer ALY1 can be obtained. The alloy layer ALY1 may be an alloy cluster formed in a part of the stress relaxation layer SR1 and in contact with the silicide layer SC1. In a region where the alloy cluster is not formed, the stress relaxation layer SR1 is in contact with the silicide layer SC1.

The barrier layer BR1 is formed on the stress relaxation layer SR1. The barrier layer BR1 is provided for preventing silicon (Si) constituting the semiconductor substrate SB1 from diffusing into the bonding layer BL1. The film thickness of the barrier layer BR1 is 50 to 300 nm, and titanium (Ti), chromium (Cr), or molybdenum (Mo), for example, is used as the barrier layer BR1.

The bonding layer BL1 is formed on the barrier layer BR1. The bonding layer BL1 forms an alloy layer with the solder layer BP1 and is a layer for ensuring strong connection between the lead LS and the back-surface electrode BS1. The film thickness of the bonding layer BL1 is 200 to 1500 nm, and nickel (Ni), for example, is used as the bonding layer BL1. The bonding layer BL1 is preferably made thicker than the barrier layer BR1, for example. Preferably, the lower portion of the bonding layer BL1 is covered with the solder layer BP1, and the upper portion of the bonding layer BL1 is exposed from the solder layer BP1. This is because the starting point of the stress from the solder layer BP1 can be kept away from the semiconductor substrate SB1 by increasing the thickness of the bonding layer BL1.

The anti-oxidation layer AOL1 is formed on the bonding layer BL1. The anti-oxidation layer AOL1 is a layer for preventing the surface of the bonding layer BL1 (the surface of the bonding layer BL1 facing the lead LS) from being oxidized. The film thickness of the anti-oxidation layer AOL1 is 100 to 2000 nm. The film thickness of the anti-oxidation layer AOL1 is less than the film thickness of the solder layer BP1. For example, gold (Au) or silver (Ag) is used as the anti-oxidation layer AOL1. FIG. 4 shows a state in which the semiconductor chip CP1 is mounted on the lead LS by the solder layer BP1. In this state, however, the anti-oxidation layer AOL1 is diffused in the solder layer BP1, so that the anti-oxidation layer AOL1 does not remain as a layer between the bonding layer BL1 and the lead LS.

The solder layer BP1 is formed on the anti-oxidation layer AOL1 or the bonding layer BL1, and the solder layer BP1 connects the semiconductor chip CP1 to the lead LS. The solder layer BP1 is a lead-free solder layer made of an alloy such as tin (Sn) and copper (Cu), tin (Sn) and silver (Ag), tin (Sn), silver (Ag), and copper (Cu), and others, and contains tin (Sn) as the main component (90% or more). The solder layer BP1 electrically and mechanically connects the semiconductor chip CP1 to the lead LS, and nickel (Ni) of the bonding layer BL1 and tin (Sn) of the solder layer BP1 form an alloy layer (Ni—Sn) in the solder layer BP1. An upper end of the solder layer BP1 is in contact with the bonding layer BL1. The upper end of the solder layer BP1 is located between the upper surface of the bonding layer BL1 and the lower surface of the bonding layer BL1.

Note that, although the stress relaxation layer SR1 is provided in the back-surface electrode BS1 in the semiconductor device SD according to the present embodiment, it has been confirmed that the stress applied by the back-surface electrode BS1 to the semiconductor substrate SB1 is the same as that of the case of the semiconductor device SD0 according to a related art.

<Method of Manufacturing Semiconductor Device>

Figure 5:
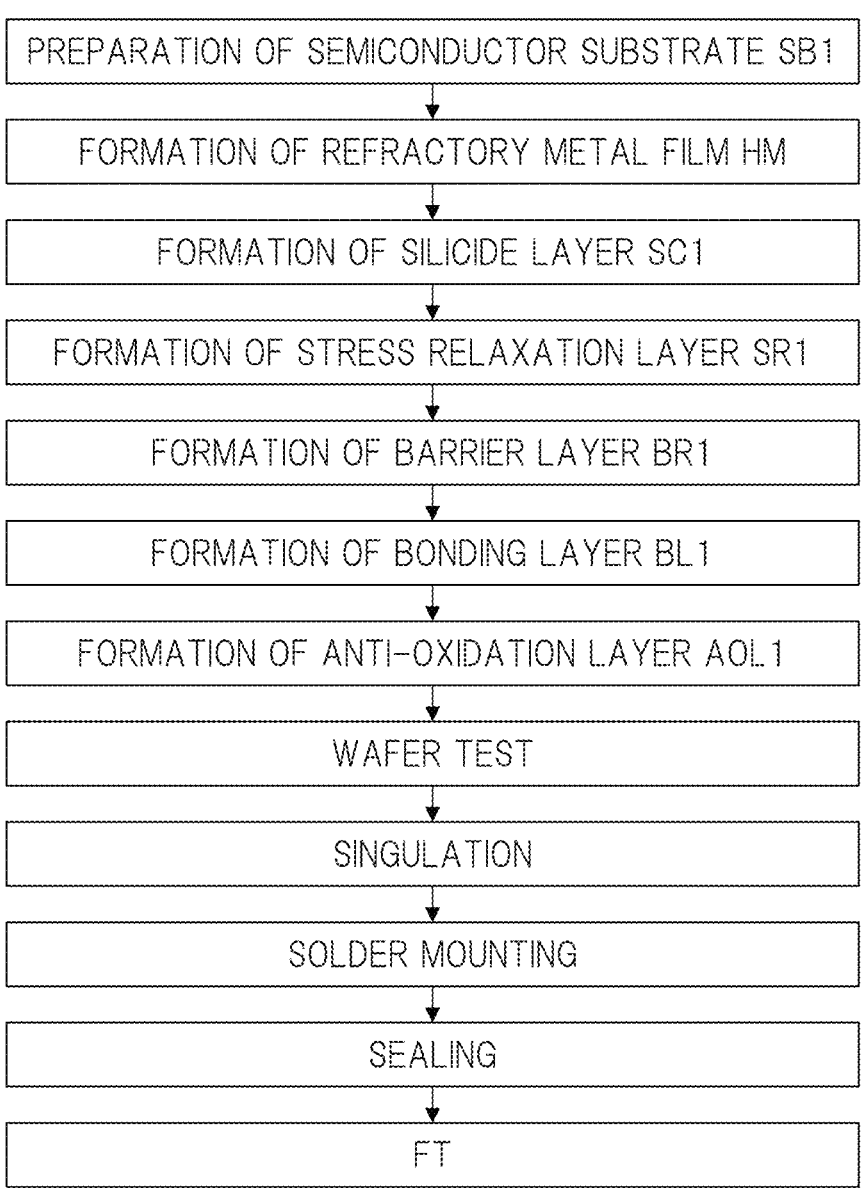
FIG. 5 is a process flowchart showing a manufacturing step of the semiconductor device according to the present embodiment.
Figure 6:
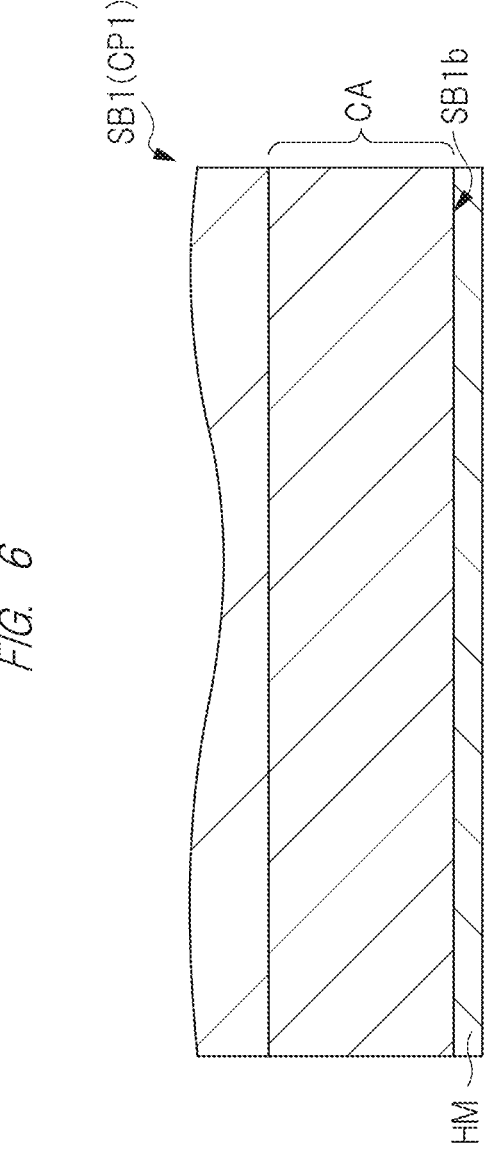
FIG. 6 is a cross-sectional view showing the manufacturing step of the semiconductor device according to the present embodiment.
Figure 7:
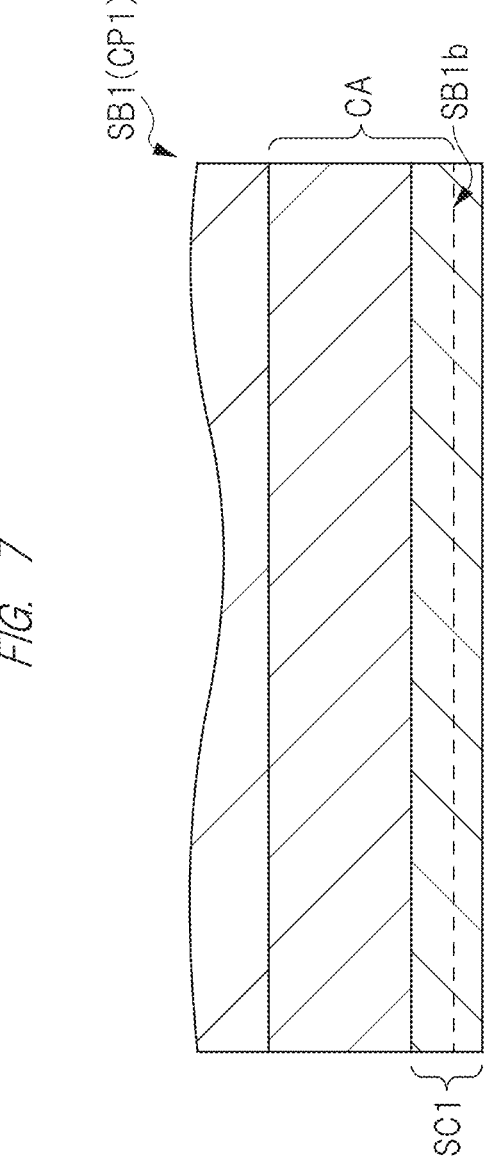
FIG. 7 is a cross-sectional view showing the manufacturing step of the semiconductor device according to the present embodiment subsequent to FIG. 6.
Figure 8:
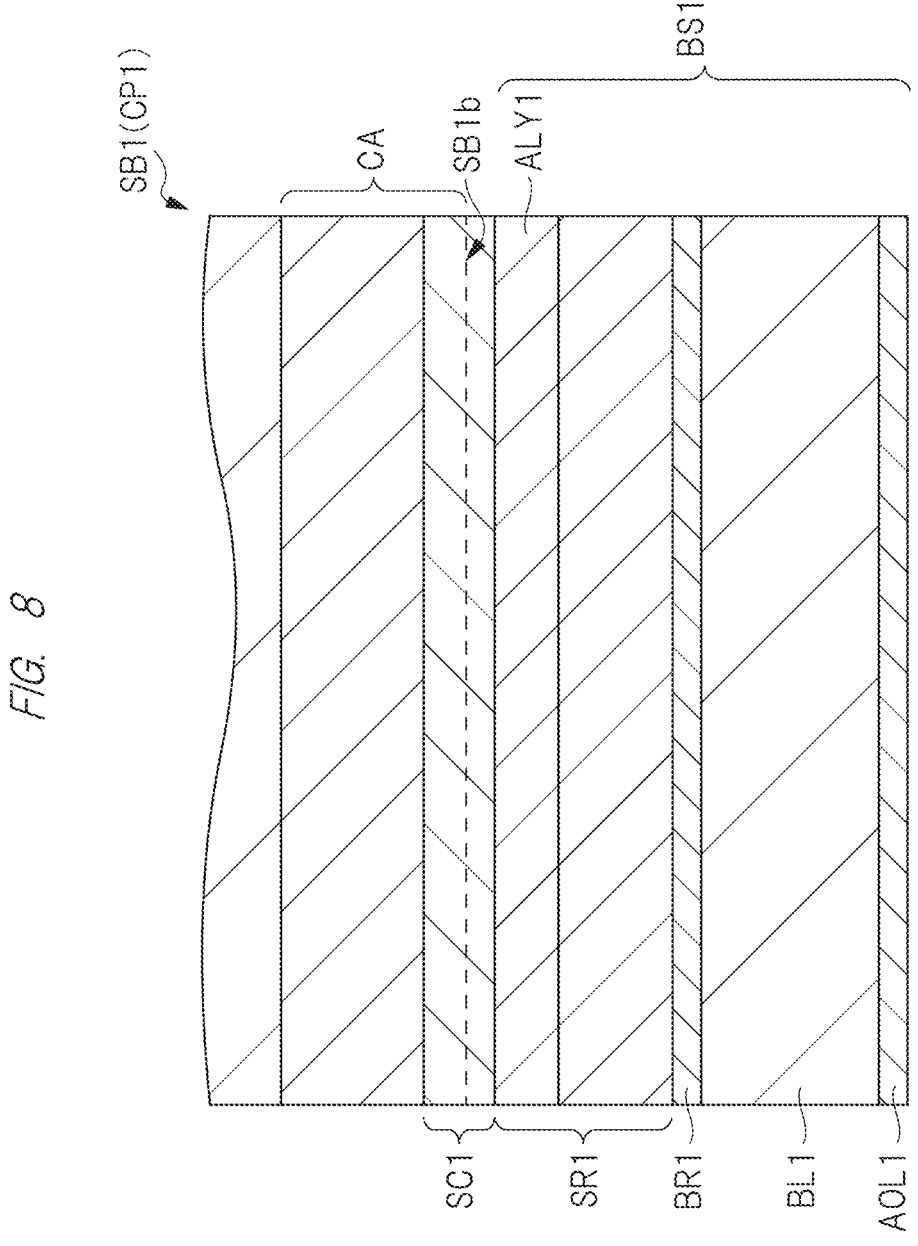
FIG. 8 is a cross-sectional view showing the manufacturing step of the semiconductor device according to the present embodiment subsequent to FIG. 7.

FIG. 5 is a process flowchart showing a manufacturing step of the semiconductor device according to the present embodiment. FIG. 6 to FIG. 8 are cross-sectional views showing the manufacturing step of the semiconductor device according to the present embodiment. From the step of "preparation of semiconductor substrate SB1" to the step of "wafer test", each step is performed on a disk-shaped semiconductor wafer in which a large number of semiconductor chips CP1 are arranged. The plurality of semiconductor chips CP1 in the semiconductor wafer is divided into individual semiconductor chips CP1 in the step of "singulation". In the step of "solder mounting", the singulated semiconductor chip CP1 is bonded to the lead LS with the solder layer BP1. Furthermore, in the step of "sealing", the semiconductor chip CP1 and the lead LS are sealed with the sealing body MR.

In the step of "preparation of semiconductor substrate SB1" shown in FIG. 5, a semiconductor wafer in which a large number of semiconductor chips CP1 having the FRDs shown in FIG. 3 fabricated in the semiconductor substrate SB1 are arranged in a matrix is prepared.

Next, in the step of "formation of refractory metal film HM" shown in FIG. 5, a refractory metal film HM is deposited on the back surface SB1b of the semiconductor substrate SB1 by sputtering as shown in FIG. 6. The cathode region CA which is an N-type semiconductor region is formed in the back surface SB1b of the semiconductor substrate SB1, and the refractory metal film HM is formed so as to be in contact with the cathode region CA. The refractory metal film HM is made of, for example, nickel (Ni) or titanium (Ti), and has a film thickness of 10 to 100 nm.

Next, in the step of "formation of silicide layer SC1" shown in FIG. 5, the silicide layer SC1 is formed on the back surface SB1b of the semiconductor substrate SB1 as shown in FIG. 7. The silicide layer SC1 is formed on the back surface SB1b of the semiconductor substrate SB1 and in the semiconductor substrate SB1 (accurately, the cathode region CA), and has a film thickness of 20 to 400 nm. The silicide layer SC1 is formed by performing the heat treatment on the semiconductor substrate SB1 (in other words, semiconductor wafer) on which the refractory metal film HM is formed. The silicide layer SC1 is made of compound of refractory metal and silicon such as nickel silicide (NiSi) or titanium silicide (TiSi).

Next, the steps of "formation of stress relaxation layer SR1", "formation of barrier layer BR1", "formation of bonding layer BL1", and "formation of anti-oxidation layer AOL1" shown in FIG. 5 are sequentially performed. As shown in FIG. 8, the stress relaxation layer SR1, the barrier layer BR1, the bonding layer BL1, and the anti-oxidation layer AOL1 are sequentially formed on the silicide layer SC1. Each step is continuously performed by the sputtering method using the sputtering apparatus provided with multiple chambers. The alloy layer ALY1 formed in the stress relaxation layer SR1 described above is formed by the increase in the temperature of the semiconductor wafer during the sputtering process in "formation of barrier layer BR1", "formation of bonding layer BL1", and "formation of anti-oxidation layer AOL1".

Next, in the step of "wafer test" shown in FIG. 5, the semiconductor wafer is vacuum-sucked on a stage of a test apparatus, and the leakage current of the FRD formed in the semiconductor wafer is measured by applying a reverse bias voltage of a predetermined value to the FRD.

Next, in the step of "singulation" shown in FIG. 5, the dicing process is performed on the semiconductor wafer to divide the semiconductor wafer into individual semiconductor chips CP1.

Next, in the step of "solder mounting" shown in FIG. 5, the semiconductor chip CP1 which has been determined as a non-defective product in the step of "wafer test" and divided in the step of "singulation" is mounted on the die pad DP of the lead LS, and the semiconductor chip CP1 is connected to the lead LS by the solder layer BP1 as shown in FIG. 4. For example, after applying the solder layer BP1 on the die pad DP of the lead LS, the semiconductor chip CP1 is mounted on the solder layer BP1, and the solder layer BP1 is melted by performing the heat treatment at about 200 to 400° C. on the solder layer BP1 and then the solder layer BP1 is hardened by cooling to room temperature.

Next, in the step of "sealing" shown in FIG. 5, the semiconductor chip CP1 and the lead LS are sealed with the sealing body MR as shown in FIG. 1. The sealing body MR is made of, for example, insulating epoxy resin.

Next, the step of "FT" shown in FIG. 5 is performed. In the step of "FT", the leakage current when applying a reverse bias to the FRD sealed with the sealing body MR is measured.

Note that, in the process flow of the manufacturing step of the semiconductor chip CP2 (IGBT) shown in FIG. 4, the process except for the step of "formation of refractory metal film HM" and the step of "formation of silicide layer SC1" shown in FIG. 5 is sequentially performed.

<Features of Semiconductor Device according to Present Embodiment>

Figure 9:
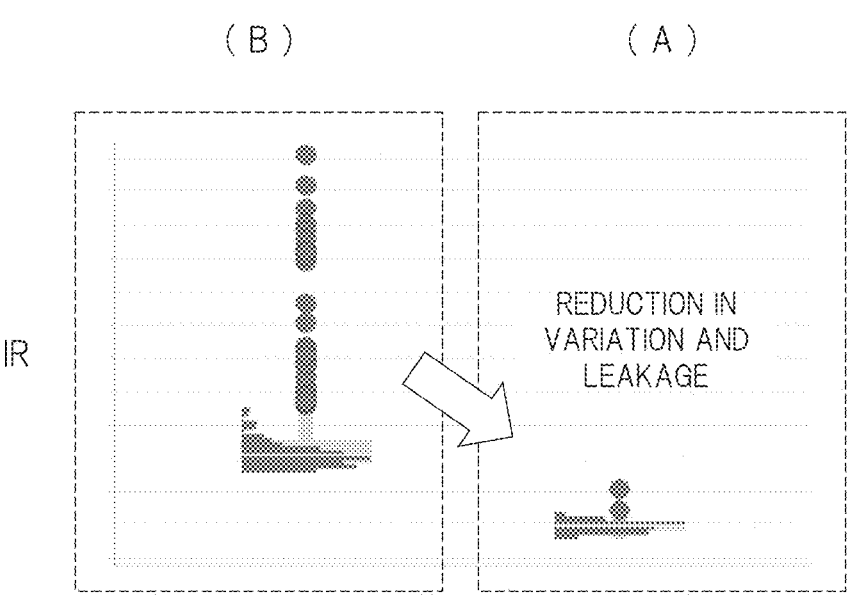
FIG. 9 is a diagram showing electrical characteristics of the semiconductor device according to the present embodiment.

Since the semiconductor device SD according to the present embodiment includes the stress relaxation layer SR1 in the back-surface electrode BS1 of the semiconductor chip CP1, the leakage current in the step of "wafer test" can be reduced, and the manufacturing yield of the semiconductor device SD can be improved. Since the stress generated in the semiconductor wafer when the semiconductor wafer is vacuum-sucked to the stage of the test apparatus in the step of "wafer test" is relaxed by the stress relaxation layer SR1 provided in the back-surface electrode BS1, the leakage current is reduced. FIG. 9 is a diagram showing electrical characteristics of the semiconductor device according to the present embodiment. Specifically, FIG. 9 shows the distribution of the leakage current values of the FRDs in the step of "wafer test", that is, the distribution of the leakage current values of a large number of semiconductor chips CP1 (FRDs) formed in one semiconductor wafer. (A) in FIG. 9 shows the distribution of leakage current values of the semiconductor device SD according to the present embodiment, and (B) in FIG. 9 shows the distribution of leakage current values of the semiconductor device SD0 according to the related art. As compared with the semiconductor device SD0 according to the related art, it is clear that variations in leakage current values are reduced and the leakage current value at the center of the Gaussian distribution is lowered in the semiconductor device SD according to the present embodiment. Therefore, not only the manu-facturing yield of the semiconductor device SD can be improved, but also the performance of the semiconductor device SD can be improved.

Since the semiconductor device SD according to the present embodiment includes the stress relaxation layer SR1 in the back-surface electrode BS1 of the semiconductor chip CP1, the leakage current can be reduced in the step of "FT" of the sealed semiconductor chip CP1 and the actual use of the semiconductor device SD, and the improvement in manufacturing yield and performance of the semiconductor device SD can be achieved. The semiconductor chip CP1 connected to the lead LS with the solder layer BP1 receives stress from the solder layer BP1, but since the stress relax-ation layer SR1 can relax the stress and the stress received by the semiconductor substrate SB1 can be relaxed, the leakage current can be reduced.

The semiconductor device SD according to the present embodiment includes the stress relaxation layer SR1 between the silicide layer SC1 and the barrier layer BR1. Namely, since the stress relaxation layer SR1 is arranged at a position as far away from the solder layer BP1 as possible, the reliability can be improved as compared with the case where the stress relaxation layer SR1 is provided between the barrier layer BR1 and the bonding layer BL1. When the stress relaxation layer SR1 is provided between the barrier layer BR1 and the bonding layer BL1, there is a risk that the solder layer BP1 covers the side wall of the stress relaxation layer SR1 due to variations in the film thickness of the solder layer BP1. The stress relaxation effect of the stress relax-ation layer SR1 is reduced in that case.

In the semiconductor device SD according to the present embodiment, the stress relaxation layer SR1 is formed on the back surface SB1$b$ of the semiconductor substrate SB1 via the silicide layer SC1 in the semiconductor chip CP1 func-tioning as an FRD, whereas the stress relaxation layer SR2 is directly formed on the back surface SB2$b$ of the semi-conductor substrate SB2 in the semiconductor chip CP2 functioning as an IGBT. Therefore, the manufacturing step of the semiconductor device SD including the semiconduc-tor chip CP1 (FRD) and the semiconductor chip CP2 (IGBT) can be reduced, so that the manufacturing cost can be reduced and the manufacturing yield can be improved.

<Modification>

The first modification relates to FIG. 4, FIG. 6, and FIG. 7. The case where the silicide layer SC1 is a nickel silicide (NiSi) layer, the stress relaxation layer SR1 is an aluminum silicon (AlSi) layer, and the nickel silicide (NiSi) layer contains vanadium (V) as an additive in FIG. 4 will be described as an example. Vanadium (V) contained in the nickel silicide (NiSi) layer segregates at the interface between the nickel silicide (NiSi) layer and the aluminum silicon (AlSi) layer. Since nickel (Ni) which has a large diffusion coefficient diffuses into the aluminum silicon (AlSi) layer, vacancies are generated in the nickel silicide (NiSi) layer, and aluminum (Al) diffuses therein. However, since vanadium (V) which has a small diffusion coefficient segregates at the interface between the nickel silicide (NiSi) layer and the aluminum silicon (AlSi) layer, it is possible to prevent the diffusion of aluminum (Al). If aluminum (Al) diffuses into the semiconductor substrate SB1, local inter-diffusion referred to as a spike occurs and causes leakage current, but it is possible to prevent the occurrence of the leakage current in this modification.

Specifically, in the step of "formation of refractory metal film HM" in FIG. 5, a nickel (Ni) film to which vanadium (V) is added (about 7%) is formed on the back surface SB1$b$ of the semiconductor substrate SB1 as shown in FIG. 6. Next, by performing the step of "formation of silicide layer SC1" in FIG. 5, vanadium (V) can be segregated at the interface between the silicide layer SC1 and the stress relaxation layer SR1 as shown in FIG. 7.

In addition, it is also possible to contain vanadium (V) as an additive in the bonding layer BL1. Vanadium (V) in the bonding layer BL1 can prevent the diffusion of the barrier layer BR1 (for example, titanium (Ti)) into the bonding layer BL1. If the diffusion of titanium (Ti) to the bonding layer BL1 progresses, the risk of deterioration in bondability between the bonding layer BL1 and the solder layer BP1 increases. Therefore, it is possible to improve the adhesion between the bonding layer BL1 and the solder layer BP1 by adding vanadium (V) to the bonding layer BL1.

The invention made by the inventors of this application has been specifically described based on the embodiment, but it is needless to say that the present invention is not limited to the embodiment described above and can be modified in various ways within the scope not departing from the gist thereof.

In addition, a part of the contents described in the above embodiment will be described below.

APPENDIX 1

A method of manufacturing a semiconductor device, the method comprising: (a) preparing a wafer-shaped semicon-ductor substrate having a main surface and a back surface, in which FRDs are fabricated; (b) forming a stress relaxation layer on the back surface; (c) forming a barrier layer on the stress relaxation layer; (d) forming a bonding layer on the barrier layer; and (e) testing the FRD while the semicon-ductor substrate is vacuum-sucked on a stage of a test apparatus, wherein the stress relaxation layer is made of a first metal film containing aluminum as a main component or a second metal film containing gold, silver, or copper as a main component.

APPENDIX 2

A method of manufacturing a semiconductor device, the method comprising: (a) preparing a wafer-shaped semicon-ductor substrate having a main surface and a back surface, in which a large number of semiconductor chips functioning as FRDs are arranged; (b) forming a stress relaxation layer on the back surface; (c) forming a barrier layer on the stress relaxation layer; (d) forming a bonding layer on the barrier layer; (e) singulating the wafer-shaped semiconductor sub-strate into the large number of the semiconductor chips; (f) mounting the semiconductor chip on a lead and connecting the lead and the bonding layer with a solder layer; and (g) testing the FRD after the step (f), wherein the stress relax-ation layer is made of a first metal film containing aluminum as a main component or a second metal film containing gold, silver, or copper as a main component.

What is claimed is:

1. A semiconductor device comprising:
   a lead;
   a semiconductor substrate mounted on the lead and hav-ing a main surface and a back surface;
   a back-surface electrode provided between the back sur-face of the semiconductor substrate and the lead; and
   a solder layer configured to connect the back-surface electrode and the lead, wherein the back-surface electrode includes:

a silicide layer formed on the back surface of the semiconductor substrate;

a bonding layer formed on the lead;

a barrier layer formed on the bonding layer; and a stress relaxation layer formed between the silicide layer and the barrier layer, wherein the solder layer connects the lead and the bonding layer, wherein the stress relaxation layer is made of a first metal film containing aluminum as a main component or a second metal film containing gold, silver, or copper as a main component, wherein the silicide layer contains refractory metal, and wherein the silicide layer contains vanadium.

2. The semiconductor device according to claim 1, wherein the first metal film contains silicon, copper, or silicon and copper as additives.

3. The semiconductor device according to claim 1, wherein Vickers hardness of the stress relaxation layer is lower than Vickers hardness of either the barrier layer or the bonding layer.

4. The semiconductor device according to claim 1, wherein an alloy layer of the first metal film or the second metal film and the refractory metal is formed in the stress relaxation layer.

5. The semiconductor device according to claim 1, wherein the barrier layer is made of a third metal film of titanium, chromium, or molybdenum.

6. The semiconductor device according to claim 1, wherein the bonding layer is made of nickel.

7. The semiconductor device according to claim 1, wherein a fast recovery diode including an anode region of P conductivity type formed on a side of the main surface, a cathode region of N conductivity type formed on a side of the back surface, and a drift region of N conductivity type formed between the anode region and the cathode region is formed in the semiconductor substrate.

8. A semiconductor device comprising:

a lead;

a first semiconductor substrate mounted on a first region of the lead, having a first main surface and a first back surface, and having a first semiconductor region of N conductivity type on a side of the first back surface;

a second semiconductor substrate mounted on a second region of the lead different from the first region, having a second main surface and a second back surface, and having a second semiconductor region of P conductivity type on a side of the second back surface;

a first back-surface electrode provided between the first back surface of the first semiconductor substrate and the lead;

a second back-surface electrode provided between the second back surface of the second semiconductor substrate and the lead;

a first solder layer configured to connect the first back-surface electrode and the lead; and a second solder layer configured to connect the second back-surface electrode and the lead, wherein the first back-surface electrode includes:

a first bonding layer formed on the lead;

a first barrier layer formed on the first bonding layer;

a first stress relaxation layer formed on the first barrier layer; and a silicide layer formed between the first stress relaxation layer and the first semiconductor region, configured to connect the first stress relaxation layer and the first semiconductor region, and made of refractory metal, wherein the second back-surface electrode includes:

a second bonding layer formed on the lead;

a second barrier layer formed on the second bonding layer; and a second stress relaxation layer formed between the second barrier layer and the second semiconductor region and configured to connect the second barrier layer and the second semiconductor region, wherein the first solder layer connects the lead and the first bonding layer, wherein the second solder layer connects the lead and the second bonding layer, and wherein the first stress relaxation layer and the second stress relaxation layer are each made of a metal film containing aluminum as a main component.

9. A method of manufacturing a semiconductor device, the method comprising:

(a) preparing a semiconductor substrate having a main surface and a back surface;

(b) forming a silicide layer on the back surface;

(c) forming a stress relaxation layer on the silicide layer;

(d) forming a barrier layer on the stress relaxation layer;

(e) forming a bonding layer on the barrier layer; and (f) mounting the semiconductor substrate on a lead and connecting the lead and the bonding layer with a solder layer, wherein the stress relaxation layer is made of a first metal film containing aluminum as a main component or a second metal film containing gold, silver, or copper as a main component, wherein the (c) includes:

(c1) forming a refractory metal film on the back surface of the semiconductor substrate; and (c2) performing a heat treatment on the semiconductor substrate to form the silicide layer on the back surface, and wherein the silicide layer contains vanadium.

10. The method according to claim 9, wherein the first metal film contains silicon, copper, or silicon and copper as additives.

11. The method according to claim 9, comprising:

between the (e) and the (f), (g) forming an anti-oxidation layer made of gold or silver on the bonding layer.

* * * * *